(12) United States Patent
Chung et al.

(10) Patent No.: US 11,296,166 B2
(45) Date of Patent: Apr. 5, 2022

(54) DISPLAY APPARATUS INCLUDING A CATHODE LAYER WITH MULTIPLE LAYERS AND METHOD OF MANUFACTURING THE DISPLAY APPARATUS

(71) Applicant: SAMSUNG DISPLAY CO., LTD., Yongin-si (KR)

(72) Inventors: Jinkoo Chung, Yongin-si (KR); Beohmrock Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 71 days.

(21) Appl. No.: 16/682,580

(22) Filed: Nov. 13, 2019

(65) Prior Publication Data
US 2020/0258947 A1 Aug. 13, 2020

(30) Foreign Application Priority Data
Feb. 8, 2019 (KR) .......................... 10-2019-0015195

(51) Int. Cl.
*H01L 27/32* (2006.01)
*H01L 51/52* (2006.01)

(52) U.S. Cl.
CPC ........ *H01L 27/326* (2013.01); *H01L 27/3227* (2013.01); *H01L 27/3276* (2013.01); *H01L 51/5225* (2013.01); *H01L 51/5228* (2013.01); *H01L 2227/323* (2013.01)

(58) Field of Classification Search
CPC ............. H01L 27/3244; H01L 27/3225; H01L 27/3227; H01L 27/326; H01L 27/3272; H01L 27/3276; H01L 2227/323; H01L 27/14603; H01L 27/14605; H01L 51/5221; H01L 51/5225; H01L 51/5228
See application file for complete search history.

(56) References Cited

U.S. PATENT DOCUMENTS

| 8,816,331 | B2 | 8/2014 | Choi et al. | |
| 9,583,547 | B2* | 2/2017 | Kim | ...................... H01L 27/326 |
| 9,620,613 | B2* | 4/2017 | Park | .................... H01L 29/4908 |
| 9,711,751 | B2* | 7/2017 | Prushinskiy | ........ H01L 27/3218 |
| 9,761,647 | B2 | 9/2017 | Lee et al. | |

(Continued)

FOREIGN PATENT DOCUMENTS

| KR | 10-2012-0124224 | 11/2012 |
| KR | 10-1223727 | 1/2013 |

(Continued)

*Primary Examiner* — Mary A Wilczewski
(74) *Attorney, Agent, or Firm* — F. Chau & Associates, LLC

(57) ABSTRACT

A display apparatus including: a substrate including a main display area and a sensor area, the sensor area including an auxiliary pixel and a transmission portion, wherein the main display area includes a main pixel; a sensor disposed in the sensor area and configured to transmit a signal through the substrate and the transmission portion, wherein the auxiliary pixel includes an auxiliary light-emitting device including an auxiliary cathode layer, and wherein the auxiliary cathode layer includes a plurality of layers partially overlapping each other at a first overlapping portion thereof, wherein the auxiliary cathode layer does not cover the transmission portion.

10 Claims, 7 Drawing Sheets

(56) References Cited

U.S. PATENT DOCUMENTS

| | | | |
|---|---|---|---|
| 9,847,486 B2 | 12/2017 | Park et al. | |
| 9,911,941 B2 | 3/2018 | Choi et al. | |
| 2011/0204369 A1* | 8/2011 | Ha | H01L 51/5228 257/59 |
| 2011/0215329 A1* | 9/2011 | Chung | H01L 51/52 257/59 |
| 2012/0280894 A1* | 11/2012 | Park | H01L 27/326 345/77 |
| 2013/0329288 A1* | 12/2013 | Yim | G02B 5/30 359/483.01 |
| 2015/0001540 A1* | 1/2015 | Chang | G09G 3/20 257/59 |
| 2015/0200236 A1* | 7/2015 | Kim | H01L 27/326 257/40 |
| 2016/0141339 A1* | 5/2016 | Prushinskiy | H01L 51/5228 257/40 |
| 2016/0155791 A1* | 6/2016 | Kim | H01L 27/3223 257/40 |
| 2016/0240811 A1* | 8/2016 | Kim | H01L 51/5234 |
| 2017/0070679 A1* | 3/2017 | Chung | G09G 3/3275 |
| 2018/0129328 A1 | 5/2018 | Park et al. | |
| 2019/0131352 A1* | 5/2019 | Choi | H01L 27/1248 |
| 2020/0183983 A1* | 6/2020 | Abe | G06F 40/20 |
| 2020/0227494 A1* | 7/2020 | Bae | H01L 27/3248 |
| 2020/0235187 A1* | 7/2020 | Bae | H01L 27/3218 |
| 2020/0258947 A1* | 8/2020 | Chung | H01L 27/326 |
| 2020/0295300 A1* | 9/2020 | Chung | H01L 27/3246 |
| 2020/0365667 A1* | 11/2020 | Jo | H01L 27/3272 |

FOREIGN PATENT DOCUMENTS

| | | |
|---|---|---|
| KR | 10-2018-0050473 | 6/2018 |
| KR | 10-2016-0130042 | 11/2018 |

\* cited by examiner

DISPLAY APPARATUS INCLUDING A CATHODE LAYER WITH MULTIPLE LAYERS AND METHOD OF MANUFACTURING THE DISPLAY APPARATUS

CROSS-REFERENCE TO RELATED APPLICATION

This application claims priority under 35 U.S.C. § 119 to Korean Patent Application No. 10-2019-0015195, filed on Feb. 8, 2019, in the Korean Intellectual Property Office, the disclosure of which is incorporated by reference herein in its entirety.

TECHNICAL FIELD

Exemplary embodiments of the present inventive concept relate to a display apparatus and a method of manufacturing the same, and more particularly, to a display apparatus including a cathode layer with multiple layers and a method of manufacturing the display apparatus.

DISCUSSION OF THE RELATED ART

Recently, the purposes of display apparatuses have diversified. In addition, as display apparatuses have become thinner and lighter, the display apparatuses have become increasingly widely used.

Since the display apparatuses are utilized in various ways, various methods may be used to design and manufacture the display apparatuses, and the number of functions that may be combined or linked with the display apparatuses is also increasing.

SUMMARY

According to an exemplary embodiment of the present inventive concept, a display apparatus including: a substrate including a main display area and a sensor area, the sensor area including an auxiliary pixel and a transmission portion, wherein the main display area includes a main pixel; a sensor disposed in the sensor area and configured to transmit a signal through the substrate and the transmission portion, wherein the auxiliary pixel includes an auxiliary light-emitting device including an auxiliary cathode layer, and wherein the auxiliary cathode layer includes a plurality of layers partially overlapping each other at a first overlapping portion thereof, wherein the auxiliary cathode layer does not cover the transmission portion.

In an exemplary embodiment of the present inventive concept, the plurality of layers of the auxiliary cathode layer includes a first auxiliary cathode layer in a first auxiliary pixel area of the sensor area, and a second auxiliary cathode layer in a second auxiliary pixel area spaced apart from the first auxiliary pixel area, and wherein the first auxiliary cathode layer is connected to the second auxiliary cathode layer to form the first overlapping portion, wherein the first auxiliary cathode layer and the second auxiliary cathode layer are adjacent to each other.

In an exemplary embodiment of the present inventive concept, the transmission portion is arranged between the first auxiliary cathode layer and the second auxiliary cathode layer.

In an exemplary embodiment of the present inventive concept, the first auxiliary cathode layer and the second auxiliary cathode layer each have rectangular shapes, and wherein at least one corner of the first auxiliary cathode layer overlaps at least one corner of the second auxiliary cathode layer to form the first overlapping portion.

In an exemplary embodiment of the present inventive concept, the first auxiliary cathode layer and the second auxiliary cathode layer have hexagonal shapes, and a corner of the first auxiliary cathode layer and a corner of the second auxiliary cathode layer constitute the first overlapping portion, wherein the corner of the first auxiliary cathode layer and the corner of the second auxiliary cathode layer face each other.

In an exemplary embodiment of the present inventive concept, the first auxiliary cathode layer and the second auxiliary cathode layer have rhombus shapes, and a side of the first auxiliary cathode layer and a side of the second auxiliary cathode layer constitute the first overlapping portion, wherein the side of the first auxiliary cathode layer and the side of the second auxiliary cathode layer face each other.

In an exemplary embodiment of the present inventive concept, the main pixel includes a main light-emitting device including a main cathode layer, and wherein the auxiliary cathode layer overlaps the main cathode layer, wherein the auxiliary cathode layer and the main cathode layer are adjacent to each other and are connected to each other to form a second overlapping portion.

In an exemplary embodiment of the present inventive concept, the main cathode layer covers an area of the main display area.

In an exemplary embodiment of the present inventive concept, the display apparatus further includes a contact portion configured to connect the auxiliary cathode layer to a cathode voltage supply wire.

In an exemplary embodiment of the present inventive concept, the contact portion is arranged in the sensor area.

According to an exemplary embodiment of the present inventive concept, a method of manufacturing a display apparatus includes: forming a display area on a substrate and including a main display area and a sensor area, the sensor area including an auxiliary pixel and a transmission portion, wherein the main display area includes a main pixel; and arranging a sensor on one side of the substrate, wherein the sensor is configured to transmit a signal through the substrate and the transmission portion, wherein the forming of the display area includes forming an auxiliary cathode layer included in an auxiliary light-emitting device of the auxiliary pixel, wherein the forming of the auxiliary cathode layer includes: forming a first auxiliary cathode layer in the sensor area by using a first mask in which a first pattern hole is formed, wherein the first auxiliary cathode layer does not cover the transmission portion; and forming a second auxiliary cathode layer in the sensor area by using a second mask in which a second pattern hole is formed, wherein the second auxiliary cathode layer does not cover the transmission portion but partially overlaps the first auxiliary cathode layer to form a first overlapping portion.

In an exemplary embodiment of the present inventive concept, the first auxiliary cathode layer is formed in a first auxiliary pixel area of the sensor area, and the second auxiliary cathode layer is formed in a second auxiliary pixel area spaced apart from the first auxiliary pixel area, and wherein the first auxiliary cathode layer is connected to the second auxiliary cathode layer to form the first overlapping portion, wherein the first auxiliary cathode layer and the second auxiliary cathode layer are adjacent to each other.

In an exemplary embodiment of the present inventive concept, the transmission portion is arranged between the first auxiliary cathode layer and the second auxiliary cathode layer.

In an exemplary embodiment of the present inventive concept, the first pattern hole and the second pattern hole have rectangular shapes, and the first auxiliary cathode layer and the second auxiliary cathode layer are formed to have rectangular shapes by the first pattern hole and the second pattern hole, and at least one corner of the first auxiliary cathode layer and at least one corner of the second auxiliary cathode layer form the first overlapping portion.

In an exemplary embodiment of the present inventive concept, the first pattern hole and the second pattern hole have hexagonal shapes, and the first auxiliary cathode layer and the second auxiliary cathode layer are formed to have hexagonal shapes by the first pattern hole and the second pattern hole, and a corner of the first auxiliary cathode layer and a corner of the second auxiliary cathode layer form a first overlapping portion, wherein the corner of the first auxiliary cathode layer and the corner of the second auxiliary cathode layer face each other.

In an exemplary embodiment of the present inventive concept, the first pattern hole and the second pattern hole have rhombus shapes, and the first auxiliary cathode layer and the second auxiliary cathode layer are formed to have rhombus shapes by the first pattern hole and the second pattern hole, and a side of the first auxiliary cathode layer and a side of the second auxiliary cathode layer form the first overlapping portion, wherein the side of the first auxiliary cathode layer and the side of the second auxiliary cathode layer face each other.

In an exemplary embodiment of the present inventive concept, the first mask further includes a third pattern hole configured to form a main cathode layer included in a main light-emitting device of the main pixel, and wherein the main cathode layer overlaps the second auxiliary cathode layer, wherein the main cathode layer and the second auxiliary cathode layer are adjacent to each other and are connected to each other to form a second overlapping portion.

In an exemplary embodiment of the present inventive concept, the main cathode layer covers an entire area of the main display area.

In an exemplary embodiment of the present inventive concept, the method further including forming a contact portion configured to connect the auxiliary cathode layer to a cathode voltage supply wire.

In an exemplary embodiment of the present inventive concept, the contact portion is formed by drilling a laser drill hole in the sensor area.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Figure 1:
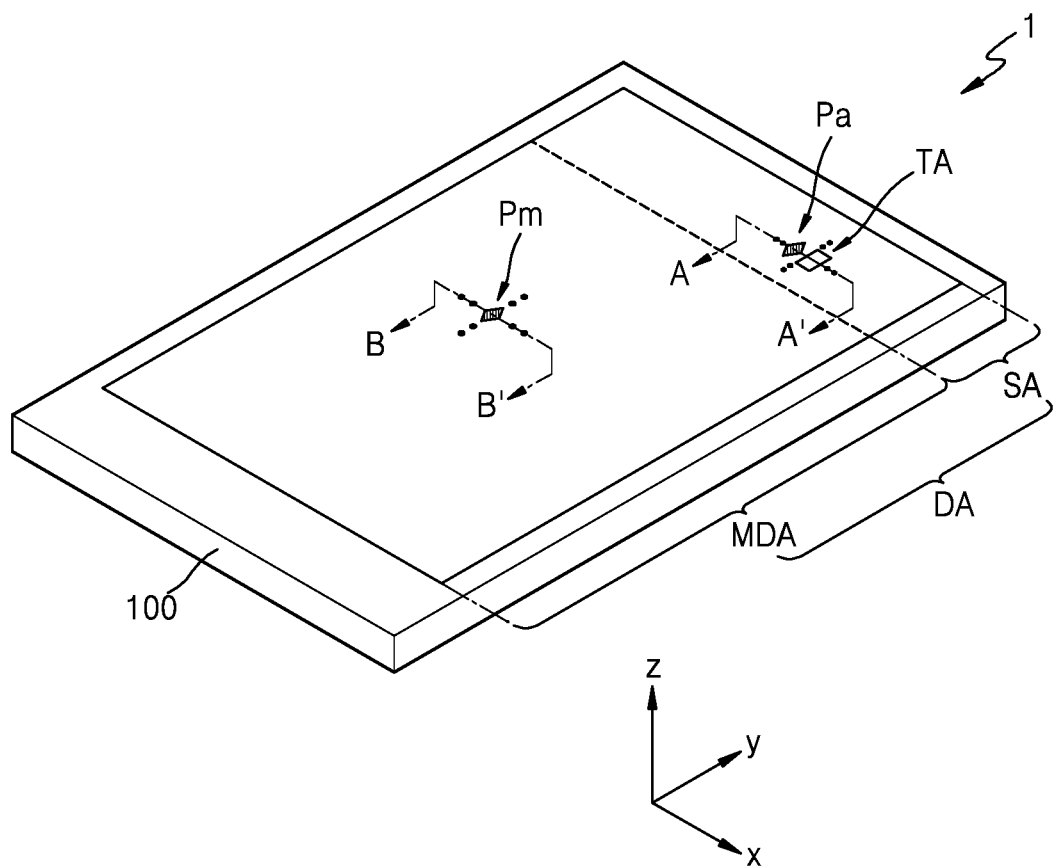
FIG. 1 is a schematic perspective view of a display apparatus according to an exemplary embodiment of the present inventive concept.

Exemplary embodiments of the present inventive concept will now be described more fully with reference to the accompanying drawings. It is to be understood that the present inventive concept may be embodied in different forms and thus should not be construed as being limited to the exemplary embodiments set forth herein. It is to be understood that like reference numerals may refer to like elements throughout the specification, and thus redundant descriptions may be omitted.

Sizes of elements in the drawings may be exaggerated for clarity. In other words, since sizes and thicknesses of components in the drawings may be exaggerated for clarity, the following exemplary embodiments of the present inventive concept are not limited thereto.

When an exemplary embodiment of the present inventive concept may be implemented differently, a process order may be different from a described order. For example, two processes that are consecutively described may be performed at substantially the same time or performed in an order opposite to the described order.

FIG. 1 is a schematic perspective view of a display apparatus 1 according to an exemplary embodiment of the present inventive concept.

As shown in FIG. 1, a display area DA of the display apparatus 1 includes a main display area MDA and a sensor area SA. The main display area MDA provides an image by using light emitted from a plurality of main pixels Pm. The sensor area SA is an area below which a component 300 (refer to FIG. 2) such as a sensor using an optical signal or a sound signal is arranged. The sensor area SA includes a transmission portion TA through which an optical signal and/or a sound signal may be transmitted. The optical signal and/or the sound signal are output from the component 300 and through the substrate 100 or proceed from outside and through the substrate 100 toward the component 300. In addition, in the sensor area SA, a plurality of auxiliary pixels Pa are arranged to provide an image by using light emitted from the auxiliary pixels Pa. For example, not only the sensor area SA, but also the main display area MDA renders an image by using the auxiliary pixels Pa. However, since the transmission portion TA is arranged in the sensor area SA, an image provided by the sensor area SA may have low resolution compared to that of the main display area MDA. For example, due to the transmission portion TA, the number of auxiliary pixels Pa, which may be arranged in a unit area, may be smaller than that of the main pixels Pm in the unit area. For example, the transmission portion TA may be provided between adjacent auxiliary pixels Pa.

Hereinafter, the display apparatus 1 according to an exemplary embodiment of the present inventive concept, an organic light-emitting display apparatus is described. However, the present inventive concept is not limited thereto. For example, various types of display apparatus such as an inorganic electroluminescence (EL) display apparatus, a quantum-dot light-emitting display, etc. may be used.

Figure 2:
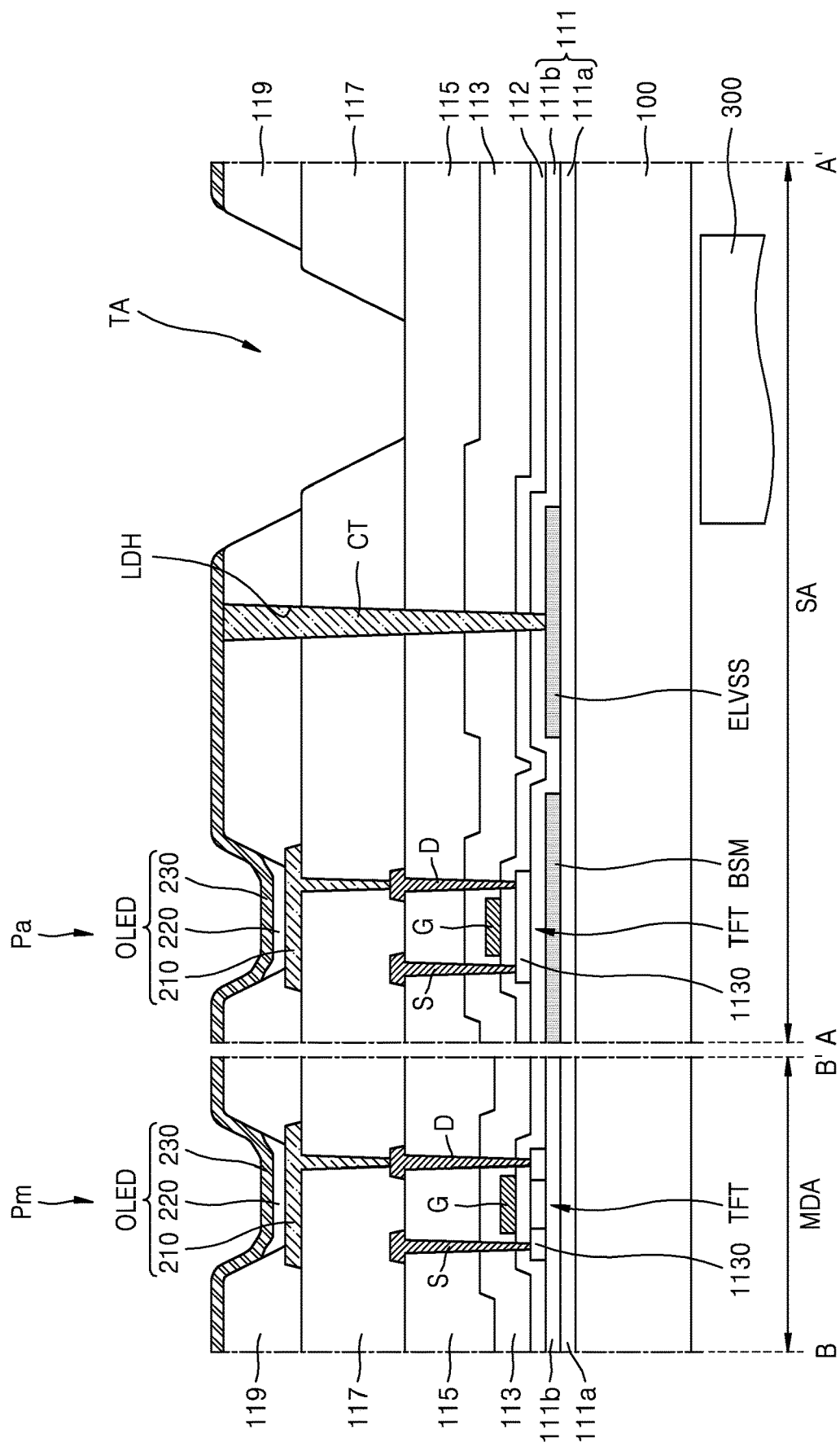
FIG. 2 is a cross-sectional view of the display apparatus taken along lines A-A' and B-B' of FIG. 1 according to an exemplary embodiment of the present inventive concept.

FIG. 2 is a cross-sectional view of the display apparatus 1 taken along lines A-A' and B-B' of FIG. 1 according to an exemplary embodiment of the present inventive concept. For example, FIG. 2 illustrates schematic cross-sectional structures of the auxiliary pixels Pa and the transmission portion TA, each in the sensor area SA, and the main pixels Pm in the main display area MDA. The main pixels Pm and the auxiliary pixels Pa each include an organic light-emitting diode OLED and a thin-film transistor TFT. The organic light-emitting diode OLED and the thin-film transistor TFT of the main pixels Pm have substantially the same structures as those of the auxiliary pixels Pa, respectively. However, as described above, it may be understood that the number of the main pixels Pm in a unit area is different from that of the auxiliary pixels Pa in the unit area. For convenience of description, the organic light-emitting diode OLED in the main pixels Pm may be referred to as a main light-emitting diode, and the organic light-emitting diode OLED in the auxiliary pixels Pa may be referred to an auxiliary light-emitting diode.

The display apparatus 1 includes the substrate 100 including the main display area MDA and the sensor area SA, and the component 300 arranged below the substrate 100 to correspond to the sensor area SA.

The component 300 may be an electronic element using light or sound. For example, the component 300 may be a sensor configured to receive and use light. For example, the component 300 may include an infrared sensor. In addition, the component 300 may be a sensor configured to output and detect light or sound to measure a distance between the component 300 and an object above the component 300 (e.g., a fingerprint). In addition, the component 300 may include a sensor configured to recognize a fingerprint, and the component 300 may include a small lamp configured to output light, a speaker configured to output sound, etc. When the component 300 is an electronic component using light, the component 300 may use light in various wavelength bands, such as visible light, infrared light, ultraviolet light, etc. A plurality of components 300 may be arranged in the sensor area SA. For example, a light-emitting device and a light-receiving device may be included together as the components 300 in a sensor area SA. In addition, both a light-emitting device and a light-receiving device may be included in the component 300.

A material of the substrate 100 may include, for example, glass or polymer resin. The polymer resin may include, for example, polyethersulphone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), cellulose acetate propionate (CAP), and/or the like. The substrate 100 including polymer resin may have flexible, rollable, or bendable characteristics. The substrate 100 may have a multi-layered structure including a layer including the above-described polymer resin, and an inorganic layer.

A buffer layer 111 on the substrate 100 may reduce or block penetration of a foreign substance, moisture, or external air from below the substrate 100, and provide a flat surface onto the substrate 100. The buffer layer 111 may include an inorganic material such as oxide or nitride, an organic material, or a composite of an organic material and an inorganic material. The buffer layer 111 may include a single-layered or multi-layered structure including an inorganic material and an organic material. Between the substrate 100 and the buffer layer 111, a barrier layer may be included, and the barrier layer may block penetration of external air. The buffer layer 111 may have a structure in which a first buffer layer 111a and a second buffer layer 111b are stacked, as shown in FIG. 2.

A semiconductor layer 1130 is arranged on the buffer layer 111. A gate electrode G is arranged on the semiconductor layer 1130 with a first gate insulating layer 112 disposed therebetween. The gate electrode G may include, for example, molybdenum (Mo), aluminum (Al), copper (Cu), titanium (Ti), etc., and have a single-layered or multi-layered structure. As an example, the gate electrode G may have a single layer including Mo.

The first gate insulating layer 112 may include, for example, silicon oxide ($SiO_2$), silicon nitride ($SiN_x$), silicon oxynitride (SION), aluminum oxide ($Al_2O_3$), titanium oxide ($TiO_2$), tantalum pentoxide ($Ta_2O_5$), hafnium oxide ($HfO_2$), zinc peroxide ($ZnO_2$), and/or the like.

A second gate insulating layer 113 may be included to cover the gate electrode G. The second gate insulating layer 113 may include, for example, $SiO_2$, $SiN_x$, SION, $Al_2O_3$, $TiO_2$, $Ta_2O_5$, $HfO_2$, $ZnO_2$, etc.

A source electrode S and a drain electrode D may be arranged on an interlayer insulating layer 115. The source electrode S and the drain electrode D may include a conductive material including, for example, Mo, Al, Cu, Ti, etc., and may include a single layer or multiple layers including the above-described material.

The drain electrode D is connected to an anode layer 210 of the organic light-emitting diode OLED.

A planarization layer 117 is arranged on the source electrode S and the drain electrode D. The organic light-emitting diode OLED may be arranged on the planarization layer 117.

The planarization layer 117 may have a flat upper surface so that the anode layer 210 is disposed on the flat upper surface. The planarization layer 117 may have a single layer or multiple layers including an organic material. The planarization layer 117 may include a polymer such as benzocyclobutene (BCB), PI, hexamethyldisiloxane (HMDSO), polymethyl methacrylate (PMMA), or polystyrene (PS), a polymer derivative containing a phenol group, an acrylic-based polymer, an imide-based polymer, an aryl ether-based polymer, an amide-based polymer, a fluorine-based polymer, a p-xylene-based polymer, a vinyl alcohol-based polymer, or a blend thereof. The planarization layer 117 may include an inorganic material. The planarization layer 117 may include, for example, $SiO_2$, $SiN_x$, SION, $Al_2O_3$, $TiO_2$, $Ta_2O_5$, $HfO_2$, $ZnO_2$, or the like. When the planarization layer 117 includes an inorganic material, chemical polishing planarization may be performed on the planarization layer 117. The planarization layer 117 may include both an organic material and an inorganic material.

The anode layer 210 may include a (semi-)light-transmitting electrode or a reflective electrode. In an exemplary embodiment of the present inventive concept, the anode layer 210 may include a reflective layer and a transparent or translucent electrode layer disposed on the reflective layer. The reflective layer may include, for example, silver (Ag), magnesium (Mg), Al, platinum (Pt), palladium (Pd), gold (Au), nickel (Ni), neodymium (Nd), iridium (Ir), chrome (Cr), or a compound thereof. The transparent or translucent electrode layer may include at least one of indium tin oxide (ITO), indium zinc oxide (IZO), zinc oxide (ZnO), indium oxide ($In_2O_3$), indium gallium oxide (IGO), or aluminum zinc oxide (AZO). In an exemplary embodiment of the present inventive concept, the anode layer 210 may include a structure in which ITO/Ag/ITO are stacked.

A pixel-defining layer 119 may be arranged on the planarization layer 117. For example, the pixel-defining layer 119 may be formed by performing spin coating on an organic insulating material such as PI, polyamide, acrylic resin, BCB, HMDSO, phenol resin, etc.

An intermediate layer 220 of the organic light-emitting diode OLED may include an organic emissive layer. The organic emissive layer may include an organic material including a fluorescent material or a phosphorescent material emitting red, green, blue, or white light. The organic emissive layer may include a low-molecular weight organic material or a polymer organic material. Below or above the organic emissive layer, functional layers such as a hole transport layer (HTL), a hole injection layer (HIL), an electron transport layer (ETL), an electron injection layer (EIL), etc. may be arranged. The intermediate layer 220 may be arranged to correspond to each of a plurality of anode layers 210. For example, the intermediate layer 220 may be disposed on the plurality of anode layers 210. However, the present inventive concept is not limited thereto. For example, the intermediate layer 220 may include a layer integrally arranged over a plurality of anode layers 210. As such, the intermediate layer 220 may be variously modified.

The cathode layer 230 may be a transparent electrode or a reflective electrode. In an exemplary embodiment of the present inventive concept, the cathode layer 230 may be a transparent or a translucent electrode, and may include a metal thin film having a low work function and including, for example, lithium (Li), calcium (Ca), lithium-fluoride-calcium (LiF/Ca), lithium-fluoride-aluminum (LiF/Al), Al, Ag, Mg, or a compound thereof. The cathode layer 230 is arranged over the main display area MDA and the sensor area SA, and may be arranged on the intermediate layer 220 and the pixel-defining layer 119.

However, the cathode layer 230 is not arranged in the transmission portion TA. For example, as described above, since the transmission portion TA is an area through which an optical signal and/or a sound signal emitted from the component 300 is transmitted, when the cathode layer 230 covers the transmission portion TA, transmittance may deteriorate, and thus, prevent precise transmission of a signal. Therefore, to prevent this, the cathode layer 230 is not arranged in the transmission portion TA. According to an experiment, when the cathode layer 230 is not arranged in the transmission portion TA, transmittance of an emitted optical signal and/or a sound signal increases 1.5 times or greater compared to when the cathode layer 230 is arranged in the transmission portion TA. A process of manufacturing the cathode layer 230 having such a characteristic structure will be described later in detail.

In addition, a blocking layer BSM is arranged between the substrate 100 and the semiconductor layer 1130, in each auxiliary pixel Pa, to prevent the thin-film transistor TFT from being affected by an optical signal or a sound signal from the component 300 adjacent to the blocking layer BSM.

A reference designation LDH denotes a laser drill hole formed in the sensor area SA by laser drilling. A connector CT is formed through the laser drill hole LDH to thereby connect the cathode layer 230 to the cathode voltage supply wire ELVSS in the sensor area SA. The cathode layer 230 in the main display area MDA is also connected to the cathode voltage supply wire ELVSS, in a manner similar to that of in the sensor area SA. Here, it may be understood that the connector CT connecting the cathode layer 230 to the cathode voltage supply wire ELVSS is arranged in the sensor area SA. For example, a connector may be arranged in the main display area MDA in a manner similar to that of the connector CT in the sensor area SA.

Although not illustrated in the drawing, a thin-film encapsulation layer may be arranged on the cathode layer 230, and at least one inorganic encapsulation layer and at least one organic encapsulation layer are stacked in the thin-film encapsulation layer. The inorganic encapsulation layer may include one or more inorganic materials such as aluminum oxide, titanium oxide, tantalum oxide, hafnium oxide, zinc peroxide, silicon oxide, silicon nitride, and silicon oxynitride. The organic encapsulation layer may include, for example, PET, PEN, PC, PI, polyethylene sulfonate, polyoxymethylene, polyarylate, hexamethyldisiloxane, acrylic-based resin (e.g., polymethyl methacrylate, polyacrylic acid, etc.) or a combination thereof.

Hereinafter, as described above, a process of forming the cathode layer 230 in the current embodiment and a result of performing the process are described in detail.

Figure 3:
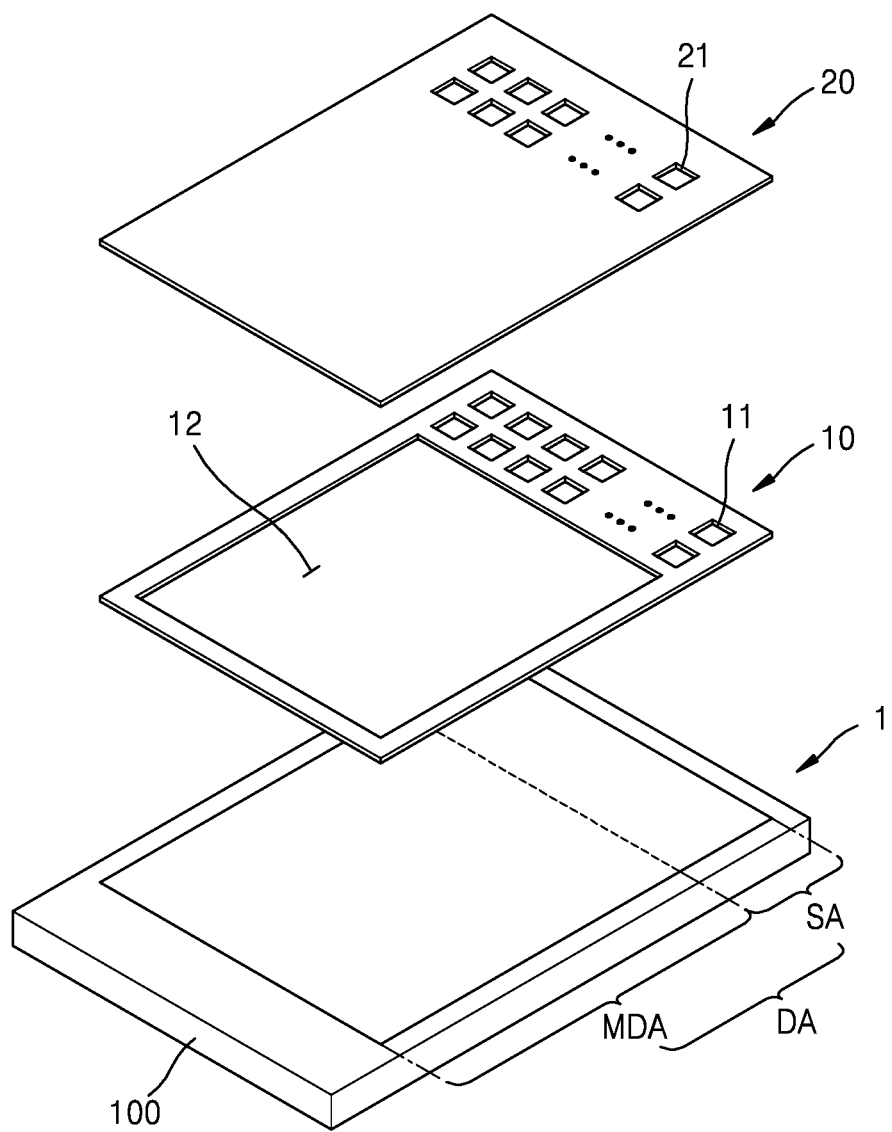
FIG. 3 is a perspective view of first and second masks configured to manufacture a cathode layer in the display apparatus of FIG. 1 according to an exemplary embodiment of the present inventive concept.

FIG. 3 illustrates a first mask 10 in which first and third pattern holes 11 and 12 are arranged, and a second mask 20 in which a second pattern hole 21 is arranged. The first to third pattern holes 11, 21, and 12 are configured to form the cathode layer 230 in the main display area MDA and the sensor area SA.

In the first mask 10, the third pattern hole 12 and the first pattern hole 11 are arranged. The third pattern hole 12 is configured to form a main cathode layer 230c (refer to FIG. 4A) over a whole area of the main display area MDA, and the first pattern hole 11 is configured to form a first auxiliary cathode layer 230a (refer to FIG. 4A) that is a part of an auxiliary cathode layer of the sensor area SA.

In addition, the second pattern hole 21 is arranged in the second mask 20, and is configured to form a second auxiliary cathode layer 230b (refer to FIG. 4A) that is a part of the auxiliary cathode layer in the sensor area SA.

The first auxiliary cathode layer 230a, the second auxiliary cathode layer 230b, and the main cathode layer 230c are connected to each other to constitute the cathode layer 230. However, in a manufacturing process, the first auxiliary cathode layer 230a, the second auxiliary cathode layer 230b, and the main cathode layer 230c are formed separately by using the first and second masks 10 and 20. Thus, the first auxiliary cathode layer 230a, the second auxiliary cathode layer 230b, and the main cathode layer 230c are provided with different names and reference numerals to provide separate descriptions.

In addition, instead of overlapping the first and second masks 10 and 20 as shown in the drawing and performing patterning at the same time, the first auxiliary cathode layer 230a and the main cathode layer 230c are formed by using the first and third pattern holes 11 and 12 in the first mask 10, and then, the second auxiliary cathode layer 230b is formed by using the second pattern hole 21 in the second mask 20. Then, the first auxiliary cathode layer 230a and the main cathode layer 230c, which are spaced apart from each other, are partially overlapped by the second auxiliary cathode layer 230b. Thus, the first auxiliary cathode layer 230a, the second auxiliary cathode layer 230b, and the main cathode layer 230c are connected to each other to constitute one body, the cathode layer 230.

Figure 4A:
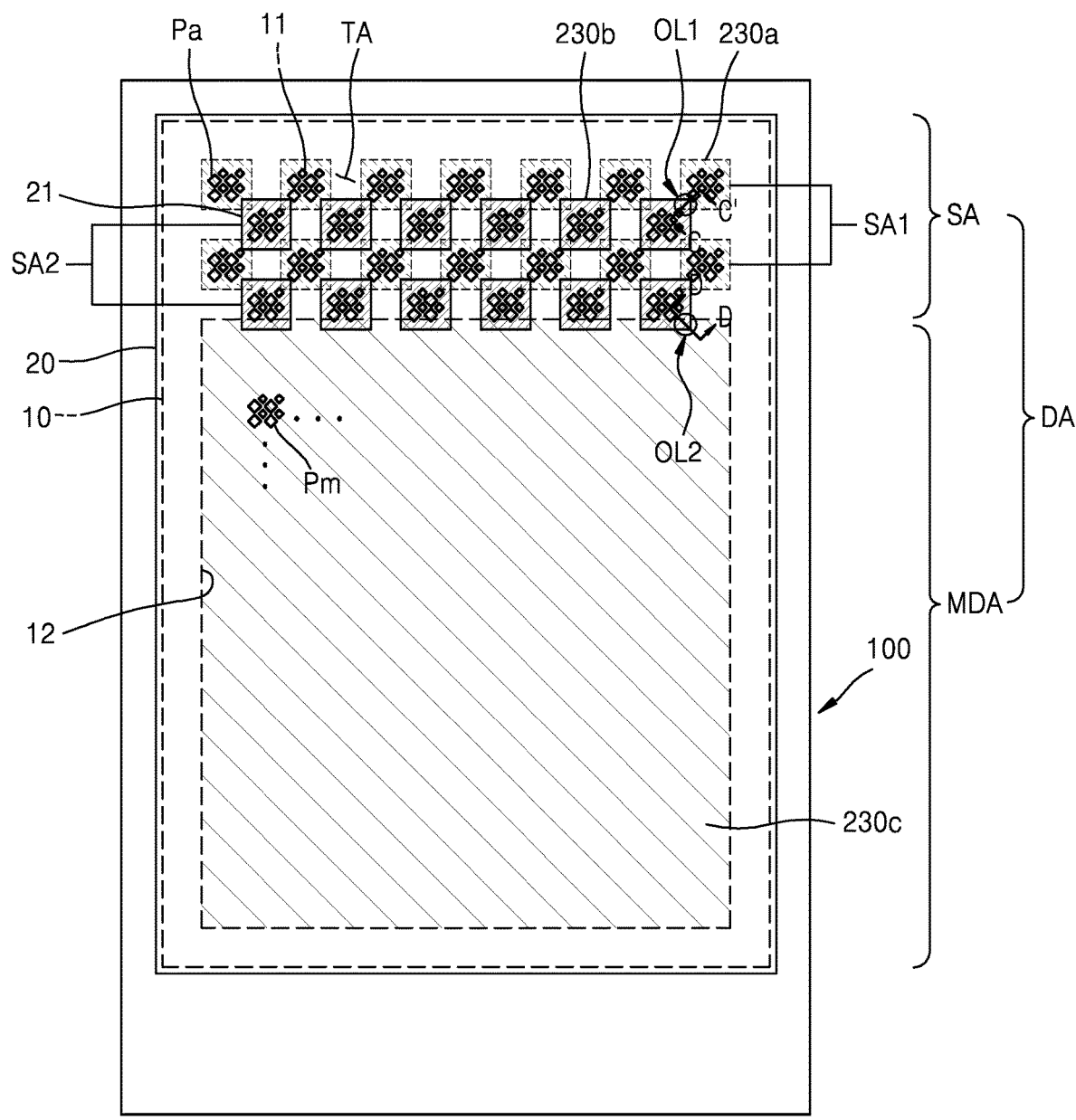
FIG. 4A is a plan view illustrating an arrangement of the first and second masks and the cathode layer, each shown in FIG. 3 according to an exemplary embodiment of the present inventive concept.

This structure may be understood by referring to a plan view illustrated in FIG. 4A. FIG. 4A illustrates that the first mask 10 overlaps the second mask 20 to show a structure in which the first auxiliary cathode layer 230a, the second auxiliary cathode layer 230b, and the main cathode layer 230c are connected to each other. In a manufacture process, the first and second masks 10 and 20 are, for example, sequentially used, as described above.

Referring to FIG. 4A, a plurality of first auxiliary cathode layers 230a are formed in a first auxiliary pixel area SA1 of the sensor area SA by using the first pattern hole 11 in the first mask 10, and the main cathode layer 230c covering all the main pixels Pm of the main display area MDA is formed by using the third pattern hole 12. At this point, each of the first auxiliary cathode layers 230a is still spaced apart from the main cathode layer 230c.

Figure 4B:
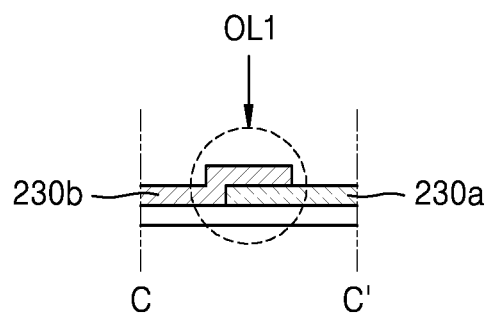
FIG. 4B is a cross-sectional view of the display apparatus taken along a line C-C' of FIG. 4A according to an exemplary embodiment of the present inventive concept.

In this state, a plurality of second auxiliary cathode layers 230b are arranged in the second auxiliary pixel area SA2 of the sensor area SA by using the second pattern hole 21 in the second mask 20. Then, the second auxiliary cathode layers 230b connect the first auxiliary cathode layers 230a to the main cathode layer 230c to thereby constitute one body. For example, as shown in the drawing, the first auxiliary cathode layers 230a and the second auxiliary cathode layers 230b have rectangular shapes as viewed in a plan view. For example, corners of the first auxiliary cathode layers 230a overlap corners of the second auxiliary cathode layers 230b, respectively, to be connected to each other to generate a first overlapping portion OL1. For example, at least one corner of each first auxiliary cathode layer 230a overlaps a corner of an adjacent second auxiliary cathode layer 230b. FIG. 4B illustrates a cross-sectional structure of the first overlapping portion OL1. As shown in the drawing, the second auxiliary cathode layer 230b overlaps the first auxiliary cathode layer 230a to thereby constitute multiple layers. Through the first overlapping portion OL1, the first auxiliary cathode layer 230a is connected to the second auxiliary cathode layer 230b to constitute one body.

Figure 4C:
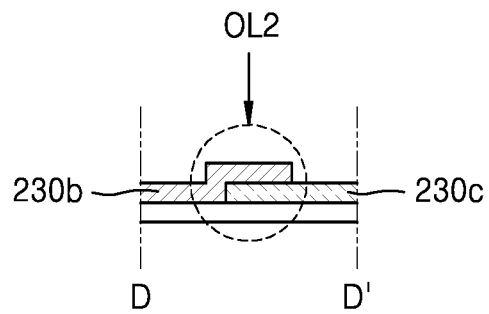
FIG. 4C is a cross-sectional view of the display apparatus taken along a line D-D' of FIG. 4A according to an exemplary embodiment of the present inventive concept.

In addition, the second auxiliary cathode layer 230b is connected to the main cathode layer 230c to form the second overlapping portion OL2. FIG. 4C illustrates a cross-sectional structure of the second overlapping portion OL2. As shown in the drawing, the second auxiliary cathode layer 230b overlaps the main cathode layer 230c to constitute multiple layers. Through the second overlapping portion OL2, the main cathode layer 230c is connected to the second auxiliary cathode layer 230b to constitute one body.

As a result, the first auxiliary cathode layer 230a is connected to the main cathode layer 230c by using the second auxiliary cathode layer 230b to constitute one body. However, the cathode layer 230 is not patterned at one time (e.g. in a single step) by using one mask, but patterned by using the first mask 10 and the second mask 20, separately, to not form the cathode layer 230 in the transmission portion TA. As described above, when the cathode layer 230 is arranged in the transmission portion TA, the cathode layer 230 may impede transmission of a signal from the component 300. Thus, in the present embodiment, the cathode layer 230 is arranged in an area in which the transmission portion TA is not arranged, to increase transmittance. However, as shown in FIG. 4A, since the transmission portion TA is arranged to be isolated between the first auxiliary cathode layer 230a and the second auxiliary cathode layer 230b, when the cathode layer 230 is to be patterned by using one mask (as in a comparative example), a shield portion to cover the transmission portion TA needs to be arranged like a floating island separate from other components. Thus, the use of a single mask and a shield portion might not be actually implemented due to difficulties during a manufacturing process. Accordingly, the first auxiliary cathode layer 230a and the main cathode layer 230c are formed by using the first mask 10, and then, the second auxiliary cathode layer 230b is formed by using the second mask 20, according to an exemplary embodiment of the present inventive concept. Thus, the cathode layer 230 may be manufactured as one body in an area in which the transmission portion TA is not arranged.

A process of manufacturing the cathode layer 230 is briefly described as follow.

Elements up to (e.g., disposed below) and including the intermediate layer 220 and the pixel-defining layer 119, each in the organic light-emitting diode OLED, are formed in the sensor area SA and the main display area MDA of the substrate 100. For example, a display area DA including the sensor area SA and the main display area MDA may be formed on the substrate 100. The sensor area includes auxiliary pixels Pa and a transmission portion Ta formed therein. Further, the component 300 may be arranged on one side of the substrate 100.

When the forming of the layers up to and including the intermediate layer 220 and the pixel defining layer 119 is finished, the first mask 10 is arranged on the substrate 100, and then, the first auxiliary cathode layer 230a and the main cathode layer 230c are formed. For example, the first mask 10 overlaps the intermediate layer 220 and the pixel defining layer 119 to form the first auxiliary cathode layer 230a and the main cathode layer 230c.

Next, the first mask 10 is removed, and the second auxiliary cathode layer 230b is formed by using the second mask 20 to thereby form the cathode layer 230 as one body in an area in which the transmission portion TA is not arranged. For example, the second mask 20 overlaps the substrate 100.

Thus, according to such a configuration and the method of manufacturing a cathode layer, since the cathode layer does not cover a transmission portion, transmittance is increased such that the component may transmit, receive and/or process a signal with less interference from surrounding elements.

Figure 5:
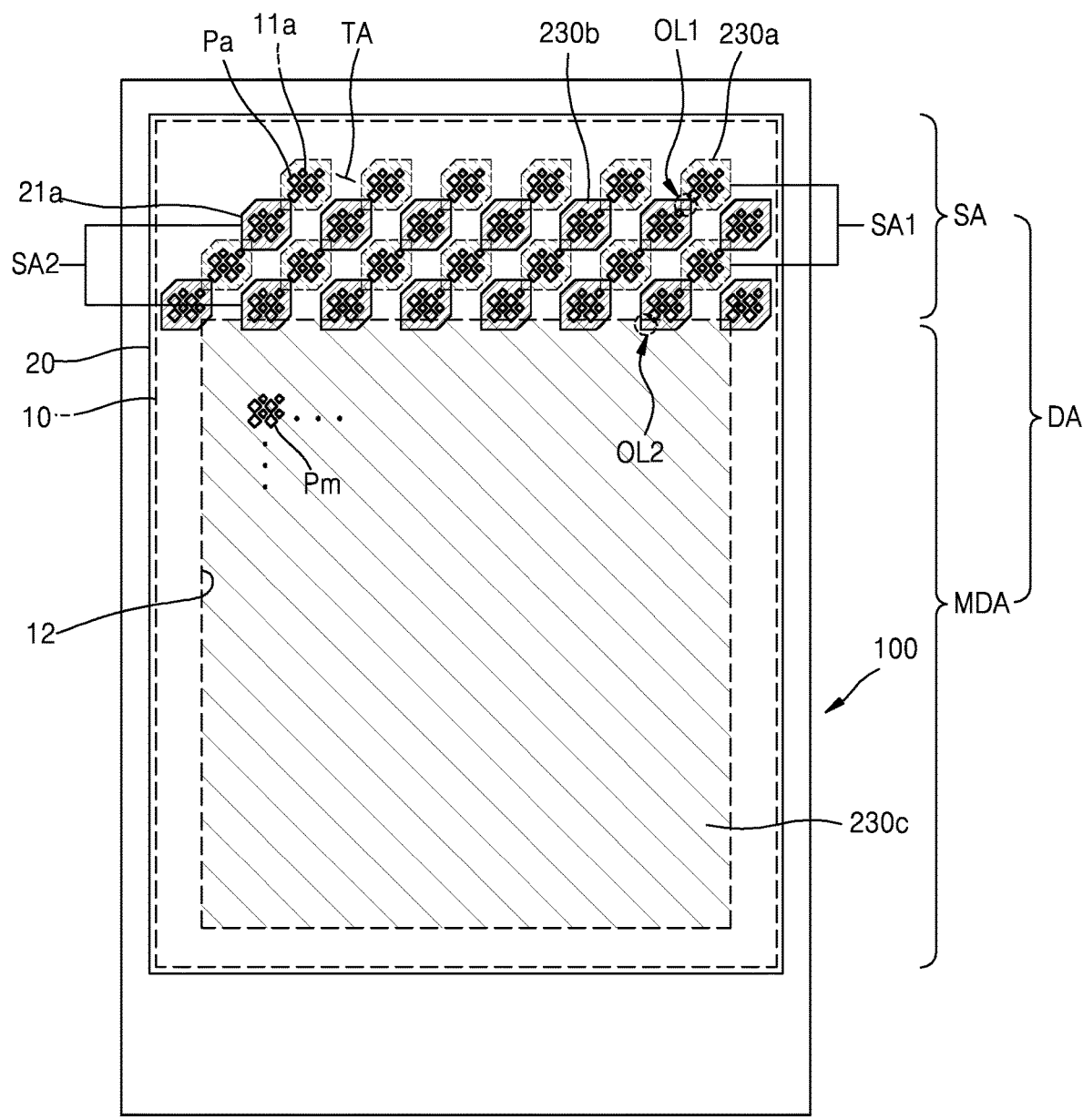
FIGS. 5 and 6 are plan views illustrating an arrangement of the first and second masks and the cathode layer, each shown in FIG. 4A according to an exemplary embodiment of the present inventive concept.

In the present embodiment described above, a case when the first and second auxiliary cathode layers 230a and 230b have rectangular shapes in a plan view is described as an example. However, as shown in FIG. 5, the first and second auxiliary cathode layers 230a and 230b may be implemented to have hexagonal shapes in a plan view. For example, a first pattern hole 11a in the first mask 10 and a second pattern hole 21a in the second mask 20 are arranged to have hexagonal shapes, and the first and second auxiliary cathode layers 230a and 230b are patterned on the substrate 100.

In this case, a pair of corners of the first auxiliary cathode layer 230a and the second auxiliary cathode layer 230b overlap with other to be connected to each other, and thus generate the first overlapping portion OL1. The pair of corners of the first auxiliary cathode layer 230a and the second auxiliary cathode layer 230b face each other. In addition, a side of the second auxiliary cathode layer 230b overlaps the main cathode layer 230c to be connected to the main cathode layer 230c, and thus, the second overlapping portion OL2 is generated. For example, even when a shape of the cathode layer 230 as viewed in a plan view is changed, the cathode layer 230 may be manufactured as one body in an area in which the transmission portion TA is not arranged, by using a similar method to that of manufacturing the cathode layer 230 having rectangular shapes.

Figure 6:
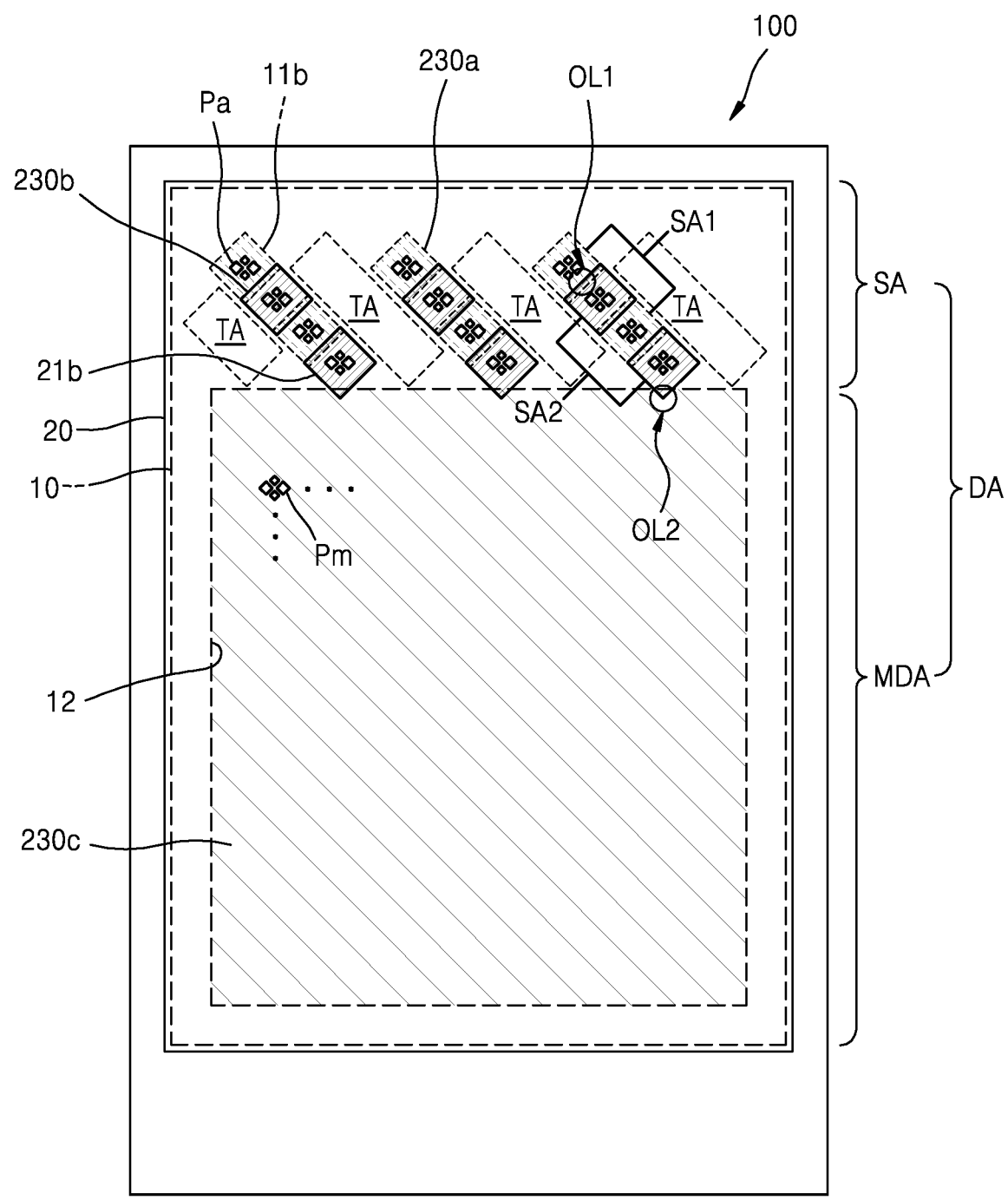

In addition, FIG. 6 illustrates the first and second auxiliary cathode layers 230a and 230b having lozenge shapes (e.g., a rhombus or diamond shape). For example, a first pattern hole 11b in the first mask 10 and a second pattern hole 21b in the second mask 20 are formed to have a polygonal shape such as a hexagonal shape, a rectangular shape, a rhombus shape, and a diamond shape, and the first and second auxiliary cathode layers 230a and 230b are patterned.

In this case, adjacent sides of the first and second auxiliary cathode layers 230a and 230b having lozenge shapes that overlap each other to be connected to each other while generating the first overlapping portion OL1. In addition, a corner of the second auxiliary cathode layer 230b overlaps the main cathode layer 230c to be connected to the main cathode layer 230c, and thus the second overlapping portion OL2 is generated. Thus, even when a shape of the cathode layer 230 as viewed in a plan view is variously modified, the cathode layer 230 may be manufactured as one body in an area in which the transmission portion TA is not arranged, by using a similar method to that of manufacturing the cathode layer 230 having rectangular shapes.

Accordingly, in the structure described above, the sensor area SA corresponding to the component 300 may also render an image, and since the cathode layer 230 in a light-emitting device does not cover the transmission portion TA, the component 300 may precisely transmit, receive and/or process a signal via the transmission portion TA. Accordingly, the display apparatus 1 having various functions and increased quality may be provided.

While the present inventive concept has been particularly shown and described with reference to exemplary embodiments thereof, it will be apparent to those of ordinary skill in the art that various changes in form and detail may be made thereto without departing from the spirit and scope of the present inventive concept.

What is claimed is:

1. A display apparatus, comprising:
a substrate comprising a main display area and a sensor area, the sensor area comprising an auxiliary pixel and a transmission portion, wherein the main display area includes a main pixel;
a sensor disposed in the sensor area and configured to transmit a signal through the substrate and the transmission portion,
wherein the auxiliary pixel comprises an auxiliary light-emitting device comprising an auxiliary cathode layer, and
wherein the auxiliary cathode layer comprises a first auxiliary cathode layer and a second auxiliary cathode layer partially overlapping each other at a first overlapping portion thereof, wherein the auxiliary cathode layer does not cover the transmission portion,
wherein the main pixel comprises a main light-emitting device comprising a main cathode layer,
wherein the auxiliary cathode layer overlaps the main cathode layer and wherein the auxiliary cathode layer and the main cathode layer are connected to each other to form a second overlapping portion.

2. The display apparatus of claim 1, wherein the first auxiliary cathode layer is in a first auxiliary pixel area of the sensor area, and the second auxiliary cathode layer is in a second auxiliary pixel area spaced apart from the first auxiliary pixel area, and
wherein the first auxiliary cathode layer is connected to the second auxiliary cathode layer to form the first overlapping portion, wherein the first auxiliary cathode layer and the second auxiliary cathode layer are adjacent to each other.

3. The display apparatus of claim 2, wherein the transmission portion is arranged between the first auxiliary cathode layer and the second auxiliary cathode layer.

4. The display apparatus of claim 2, wherein the first auxiliary cathode layer and the second auxiliary cathode layer each have rectangular shapes, and
wherein at least one corner of the first auxiliary cathode layer overlaps at least one corner of the second auxiliary cathode layer to form the first overlapping portion.

5. The display apparatus of claim 2, wherein the first auxiliary cathode layer and the second auxiliary cathode layer have hexagonal shapes, and
a corner of the first auxiliary cathode layer and a corner of the second auxiliary cathode layer constitute the first overlapping portion, wherein the corner of the first auxiliary cathode layer and the corner of the second auxiliary cathode layer face each other.

6. The display apparatus of claim 2, wherein the first auxiliary cathode layer and the second auxiliary cathode layer have rhombus shapes, and
a side of the first auxiliary cathode layer and a side of the second auxiliary cathode layer constitute the first overlapping portion, wherein the side of the first auxiliary cathode layer and the side of the second auxiliary cathode layer face each other.

7. The display apparatus of claim 2,
wherein the auxiliary cathode layer and the main cathode layer are adjacent to each other.

8. The display apparatus of claim 7, wherein the main cathode layer covers an area of the main display area.

9. The display apparatus of claim 1, further comprising a contact portion configured to connect the auxiliary cathode layer to a cathode voltage supply wire.

10. The display apparatus of claim 9, wherein the contact portion is arranged in the sensor area.

* * * * *